United States Patent [19]

Yamamoto et al.

[11] Patent Number: 4,711,807

[45] Date of Patent: Dec. 8, 1987

[54] INSULATING MATERIAL OF NON-SINGLE CRYSTALLINE SILICON COMPOUND

[75] Inventors: Kenji Yamamoto; Takehisa Nakayama; Yoshihisa Tawada, all of Kobe, Japan

[73] Assignee: Kanegafuchi Kagaku Kogyo Kabushiki Kaisha, Osaka, Japan

[21] Appl. No.: 802,101

[22] Filed: Nov. 25, 1985

[30] Foreign Application Priority Data

Nov. 28, 1984 [JP] Japan ................................ 59-250869

[51] Int. Cl.$^4$ ............................................. B32B 15/00
[52] U.S. Cl. ...................................... 428/334; 427/39; 428/450; 501/88; 501/90
[58] Field of Search ...................... 428/447, 450, 334; 427/39, 85; 501/88, 90

[56] References Cited

U.S. PATENT DOCUMENTS 4,161,743 7/1979 Yonezawa et al. .................. 427/85

OTHER PUBLICATIONS

J. Appl. Phys., "Microstructure and Properties of Rf-Sputtered Amorphous Hydrogenated Silicon Films", vol. 52, No. 8, pp. 5329-5339 (Aug., 1981).

Primary Examiner—Edith Buffalow
Attorney, Agent, or Firm—Armstrong, Nikaido, Marmelstein & Kubovcik

[57] ABSTRACT

An insulating material of non-single crystalline silicon compound comprising a silicon compound which includes argon. The insulating material realizes a high breakdown voltage and heat-resistivity. The insulating material can be preferably employed as an insulator for substrates in various electronic fields.

8 Claims, 3 Drawing Figures

INSULATING MATERIAL OF NON-SINGLE CRYSTALLINE SILICON COMPOUND

BACKGROUND OF THE INVENTION

The present invention relates to an insulating material composed of a non-single crystalline silicon compound including argon atom.

In this specification and Claims, the wording "non-single crystalline" means amorphous, micro crystalline or poly crystalline.

In a fabrication of a solar cell, there hitherto has been widely used a ITO/glass substrate or $SnO_2$/glass substrate with a transparent conducting film such as ITO (indium tin oxide) or $SnO_2$ being formed on a light-transparent substrate, and also a metal substrate such as a stainless steel, iron, aluminum, nickel, brass, copper, zinc or an alloy thereof, or a metal which is surface-treated with another metal.

In case that a conducting substrate such as a metal substrate is used for a substrate of a solar cell, the substrate and the lower electrode of the solar cell which is placed on the substrate must be electrically insulated from each other. This is because a plurality of cells is patterned and formed on a single substrate, and those cells are connected to each other in series. Therefore, an insulator is provided on a conducting substrate for this purpose. As a material of such an insulator, it is needed that the material is heat-resistant because a fabricating process of a solar cell essentially includes a process wherein a temperature of substrate reaches about 200° to 350° C. Therefore, a heat-resistant organic high polymer material, such as an imide resin is generally applied to a substrate by spin coating or dipping method, and heat-treated for the purpose of curing, degassing, and the like.

In general, the higher a film-forming temperature of a solar cell is, the better quality of the solar cell can be obtained. However, in case that a solar cell is fabricated by use of a substrate on which an insulator layer of imide resin or the like is provided as mentioned above, the temperature of the substrate is limited at most to 250° C., hence a solar cell of good quality cannot be obtained. In addition, a condensation occurs in the insulator layer while the substrate is heated and as a result, $H_2O$ or other impurities will be released, so that a quality of the solar cell might be further reduced. There is also proposed an insulating material wherein the insulation is realized by use of a non-single crystalline silicon. In that case, a limit of a voltage per unit thickness beyond which a dielectric breakdown occurs (hereinafter referred to as "breakdown voltage") is as low as 20 to 30 V/$\mu$m, hence the insulator layer must be deposited thick.

An object of the present invention is to provide an insulating material in which the insulation property and heat-resistant property are both fairly good as compared with the coventional insulating material composed of polymer material, non-single crystalline silicon, or the like.

This and other objects of the invention will become apparent from the description hereinafter.

SUMMARY OF THE INVENTION

It has been found that the above and the other objects of the invention are obtained by providing an insulating material composed of a non-single crystalline silicon compound including argon atom. The insulating material of the invention can be prepared by forming a non-single crystalline silicon layer from a reactive gas being added to it an argon gas by means of plasma CVD (chemical vapor deposition). In the insulating material of the invention, a breakdown voltage is high and heat-resistant property is fairly good, thus the thickness of the insulator can be made so thin as to obtain a necessary breakdown voltage. Therefore, the insulating material of the present invention can be employed as an insulator layer for an insulating substrates which are required in various electronics field, e.g. vessels of semiconductors, or the like.

DETAILED DESCRIPTION

Figure 1:
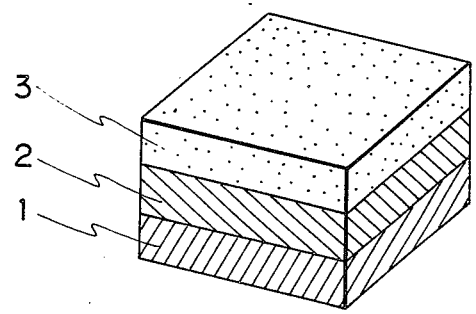
FIG. 1 is an explanatory view of an embodiment of an insulator made of the insulating material of the invention.

The insulating material of the invention is generally formed on a substrate. Examples of substrate used for this purpose are conducting substrates such as metal substrates of a thickness in a range of about 0.03 to about 1 mm made of stainless steel, iron, aluminum, nickel, brass, copper, zinc, or the like, but are not limited within the above materials.

The insulating material of the invention is a silicon compound which includes argon atom of preferably 0.01 to 10 atomic % and most preferably 0.1 to 4 atomic %. When a content of argon is less than 0.01 atomic %, the breakdown voltage is lowered. The insulating material can also include in it at least one kind of carbon atom, nitrogen atom, oxygen atom, boron atom, sulfur atom, germanium atom, and the like.

A thickness of the insulator layer made of the insulating material of the invention is not limited but is preferably in a range of 0.5 to 100 $\mu$m, and most preferably 1 to 10 $\mu$m. When a thickness is in a range of 0.5 to 100 $\mu$m, a breakdown voltage of about 300 to 5000 V/$\mu$m or more can be realized. When a thickness is less than 0.5 $\mu$m, there appear many pinholes. When a thickness is above 100 $\mu$m, the film easily peels off owing to an internal stress. When a thickness is within a range of 1 to 30 $\mu$m, a breakdown voltage of about 100 to about 1000 V/$\mu$m is realized and in addition, pinholes grow less and the film hardly peels off.

The insulating material of the invention is prepared by forming a film on the above-mentioned substrate from a reactive gas being added to it an argon gas, for instance, by means of plasma CVD.

Examples of the above reactive gasses are mixed gasses of gaseous compounds including silicon such as $SiH_4$, $Si_2H_6$, $SiH_3Cl$, $SiF_4$, $Si_2F_6$, $SiHF_3$, and the like, and other gas which is mixed with the above gaseous silicon compound in an amount of 20 to 90% by mole. Examples of the above other gases are, for instance, gaseous compounds of hydrocarbon such as $CH_4$, $C_2H_4$, $C_2H_2$, $C_2H_6$, above compounds of hydrocarbon being partially or completely substituted with halogen, and ammonia, $NF_3$, $N_2$, $O_2$, $N_2O$, and the like.

Preferably, a mixing proportion of argon gas to be mixed with the above reactive gas is 20 to 98% by mole, and most preferably, 50 to 90% by mole. When the proportion of argon gas is less than 20% by mole, an argon atom content of the formed insulating material of non-single crystalline silicon becomes less than 0.01 atomic %, whereby the insulation property is not improved (electric conductivity is not decreased). When the content is more than 98% by mole, the forming rate of the non-single crystalline silicon layer becomes less.

The insulating material having a composition of amorphous (a-) SiC:H:Ar prepared by a decomposition of a mixed gas of, for instance, $SiH_4$ of 40 sccm, $C_2H_4$ of 50 sccm and Ar of 200 sccm, where sccm indicates the standard cubic centimeter per minute, realizes a breakdown voltage of more than about 500 V/μm, and the prepared insulating material is preferably used as an insulator layer for a substrate of a semiconductor which is formed by means of glow-discharge decomposition.

An insulating material of the invention is hereinafter explained referring to FIGS. 1 and 2.

FIG. 1 is an explanatory view of an arrangement wherein an insulating material 2 of the invention is formed on a substrate 1 and a metal thin film 3 is provided on the insulating material 2.

Figure 2:
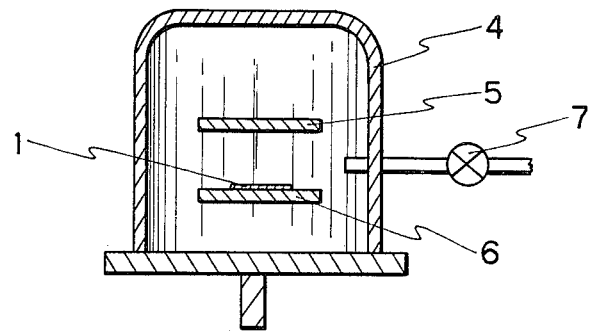
FIG. 2 is an explanatory schematic sectional view of an embodiment of a fabrication apparatus which is used in the invention.

FIG. 2 is an explanatory schematic sectional view of an embodiment of a vacuum apparatus in which an insulating material of the invention is formed on a substrate by means of plasma CVD.

A process for preparing an insulating material of the invention by plasma CVD utilizing the appartus of FIG. 2 is described as follows:

As in FIG. 2, a substrate 1 is placed on a ground electrode 6, and an atmosphere in the vacuum container 4 is once decompressed to $1 \times 10^{-6}$ to $10 \times 10^{-6}$ Torr. Thereafter a valve 7 is turned on to let a gas of a fixed composition of silane, argon, etc. into the container. The pressure of the gas is maintained within a range of about $10^{-2}$ to about 5 Torr, and a direct voltage or a radio-frequency voltage of 1 kHz to several tens of MHz is applied between electrodes 5 and 6 to make a plasma inside the vacuum container 4. A non-single crystalline insulating material composed of a silicon compound including argon atom is formed on the substrate 1 in a thickness of about 0.5 to about 100 μm under the above atmosphere after an interval of a few minutes to several hours.

In the foregoing, a process of forming an insulating material of the invention is described by employing a plasma CVD method, but the process is not limited within plasma CVD method. For instance, the insulating material of the invention can be formed by employing a sputtering evaporation method as described hereinafter, and further a glow-discharge method or an ion plating method can be employed.

A substrate 1 is provided on an electrode 6 in the apparatus, e.g. of FIG. 2, and a pressure of the vacuum container 4 is once decompresed to $1 \times 10^{-6}$ to $10 \times 10^{-6}$ Torr. Thereafter, by turning on a valve 7, a mixed gas of argon and the other gases is introduced to a container 4. The other gases include, for example, an inert gas such as helium, a hydrogen gas, a hydrocarbon gas and a gaseous compound including silicon. The pressure is maintained under about $5 \times 10^{-3}$ to $10^{-1}$ Torr. A direct voltage or a radio-frequency voltage of 1 kHz to several tens of MHz is applied between electrodes 5 and 6. The elctrode 5 has a target of SiC, graphite, silicon, or the like. A substrate 1 is provided on the electrode 6. Then, there appears a plasma inside the vacuum container 4. After an interval of a few minutes to several hours under the above condition, an insulator layer 2 made of the insulating material of the invention is formed in a thickness of 0.5 to 100 μm. In order to from a plasma, an applied voltage of about 1 to 3 kV, an electric current of about 100 to about 300 mA and an applied power of about 100 to about 300 W are preferably employed.

A metal layer of about 500 Å to 1 μm is formed on the insulator layer 2 which is provided on the substrate 1. The metal layer is formed, for instance, by means of evaporation or sputtering by using a material such as aluminum, molybdenum, stainless steel, antimony, chrominum or nichrome all of which have a proper electric conductivity. In such a manner, a substrate 1 on which an insulator layer 2 and a metal electrode 3 are provided is obtained as illustrated in FIG. 1.

In a process of preparing an insulating material of the invention, a heat treatment is not necessarily included in that process as in the case that a imide resin is employed as an insulating material. The heat-resistant property of the insulating material of the invention is better than that of the imide resin, and degassing does not take place during a heating process in the subsequent fabrication process of solar cell, thus a film of solar cell can be formed at a high temperature and the property of the solar cell is bettered. In addition, when an insulating material is formed by plasma CVD or sputtering, the film can be formed so uniformly as compared with the case when an imide resin is formed by spin coating method or dipping method, thereby increasing a yield of production. The insulating material of the invention realizes a breakdown voltage of more than 50 V/μm, in preference not less than 100 V/μm.

The insulating material of the invention is explained by the following Examples. It is to be understood that the present invention is not limited to Examples, and various changes and modifications may be made in the invention without departing from the spirit and scope thereof.

EXAMPLE 1

In the embodiment of Example 1, an apparatus of FIG. 2 is used by employing a plasma CVD method.

As a substrate 1, a stainless steel of 0.2 mm thick was placed on the electrode 6. The interval between the electrode 5 and the electrode 6 is 20 mm. The substrate was heated to a temperature of 250° C. at the surface thereof. The pressure of the vacuum container 4 was decreased to $1 \times 10^{-6}$ Torr, and a mixed gas of silane of 40 sccm, hydrogen of 40 sccm and argon of 100 sccm was introduced from the valve 7, and then the pressure was kept to 1.5 Torr. A radio-frequency voltage of a power of 30 W and a frequency of 13.56 MHz was applied between the electrodes 5 and 6 to make a plasma inside the container. The above state was maintained for an hour and an insulator layer 2 was formed on the substrate.

Thus obtained insulator layer was 2 μm thick, and the optical band gap energy Eg(opt) was 1.7 eV. The argon content in the insulating material was measured as 1 atomic % by means of Auger electron spectroscopy.

Thereafter, a metal electrode 3 was formed on the surface of the insulator layer 2 by electron-beam evaporating chromium in a thickness of 1000 Å. Electric conductiviy and breakdown voltage was measured by applying a voltage between the substrate 1 and the metal electrode 3. The results were $10^{-10}(\Omega\text{cm})^{-1}$ and about 40 V/μm, respectively.

COMPARATIVE EXAMPLE 1

An insulating material was formed in the same manner as in Example 1 but the argon gas was not added. The measured electric conductivity and breakdown voltage were $10^{-9}(\Omega\text{cm})^{-1}$ and 20 V/μm, respectively. Eg(opt) of the obtained a-Si:H was 1.7 eV.

EXAMPLE 2

In Example 2, the gas was composed of SiH$_4$ of 40 sccm, C$_2$H$_2$ of 50 sccm and argon of 200 sccm, and the other conditions were the same as in Example 1. Thus obtained insulating material was measured and the electric conductivity and breakdown voltage were $10^{-14}(\Omega\text{cm})^{-1}$ and 500 V/μm, respectively. The Eg(opt) of the obtained a-SiC:H:Ar was 2.6 eV, and the argon content was 1 atomic % and the carbon content was 50 atomic %.

COMPARATIVE EXAMPLE 2

An insulating material was formed in the same manner as in Example 2 but the argon gas was not added. The electric conductivity and breakdown voltage were $10^{-13}(\Omega\text{cm})^{-1}$ and 300 V/μm, respectively. The Eg(opt) of the obtained a-SiC:H was 2.6 eV.

The breakdown voltage Eb and optical band gap energy Eg(opt) are connected with a relationship:

$$Eb \propto \exp[Eg(opt)]$$

Figure 3:
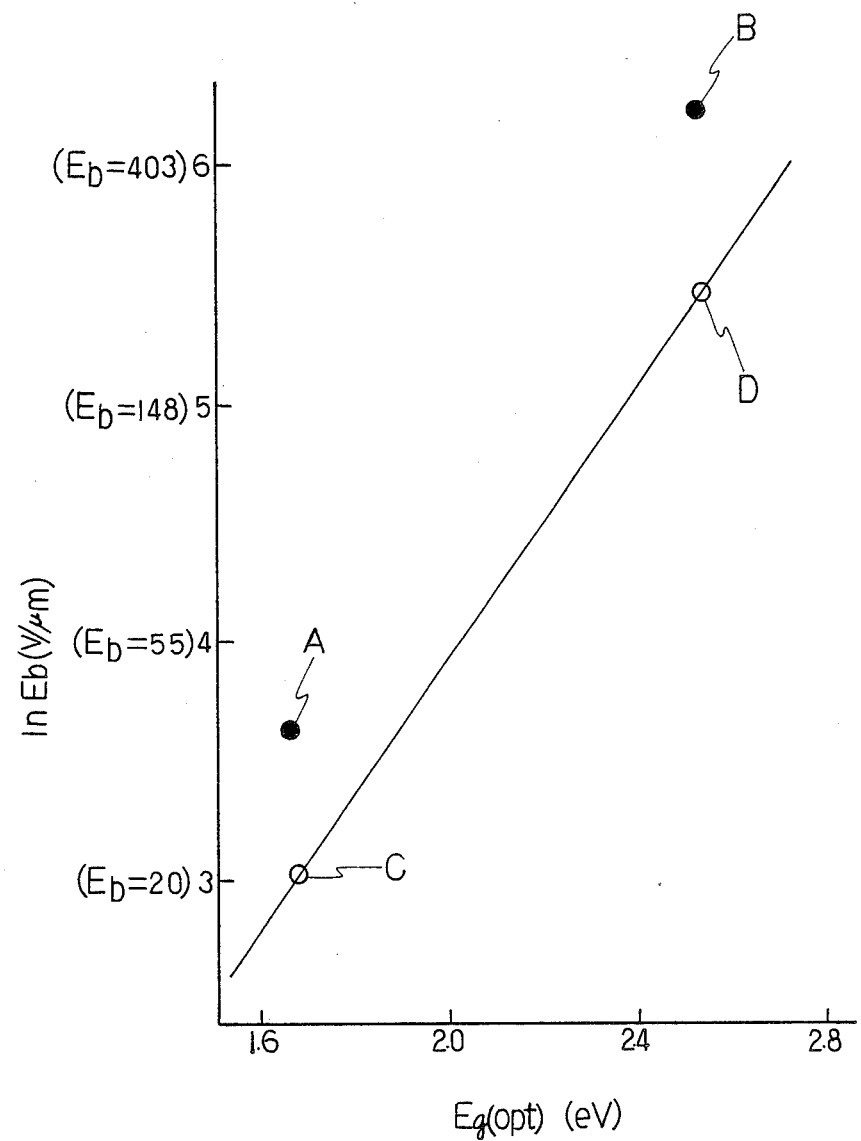
FIG. 3 is a graph showing a relationship between a breakdown voltage (Eb) and an exp[Eg(opt)] of the obtained insulating materials in Examples 1 to 2 and Comparative Examples 1 to 2.

The above relationship in the insulating materials prepared in Examples 1 to 2 and Comparative Examples 1 to 2 are shown in FIG. 3, wherein the point A indicates a measured value of the insulating material of Example 1, and B, C and D are of Example 2, Comparative Example 1 and Comparative Example 2, respectively.

From FIG. 3, it is seen that the breakdown voltage of the insulator film formed by use of a gas including argon is higher than that formed by use of a gas wherein an argon gas is not included.

What we claim is:

1. An insulating material comprising a non-single crystalline silicon compound having an argon content greater than or equal to 0.01 and less than or equal to 10 atomic %, and having a breakdown voltage of not less than 50 V/μm.

2. The insulating material of claim 1, wherein at least one element selected from the group consisting of carbon, nitrogen, oxygen, boron, sulfur, and germanium is included in said silicon compound.

3. The insulating material of claim 1, wherein a breakdown voltage of the material is not less than 500 V/μm.

4. The insulating material of claim 1, wherein the silicon compound is a-SiC.

5. The insulating material of claim 1, wherein the insulating material is deposited on a metal film substrate.

6. The insulating material of claim 1, wherein the silicon compound is formed as an insulator layer of 0.5 to 100 μm in thickness.

7. The insulating material of claim 1, wherein the silicon compound is formed by a plasma CVD method.

8. The insulating material according to claim 1, wherein said breakdown voltage is not less than 100 V/μm.

* * * * *